United States Patent
Mizawa et al.

(10) Patent No.: US 9,548,262 B2
(45) Date of Patent: Jan. 17, 2017

(54) METHOD OF MANUFACTURING SEMICONDUCTOR PACKAGE AND SEMICONDUCTOR PACKAGE

(71) Applicant: SHINDENGEN ELECTRIC MANUFACTURING CO., LTD., Tokyo (JP)

(72) Inventors: Yuichi Mizawa, Hanno (JP); Takeo Nagase, Higashine (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 47 days.

(21) Appl. No.: 14/648,558

(22) PCT Filed: Sep. 29, 2014

(86) PCT No.: PCT/JP2014/075819
§ 371 (c)(1),
(2) Date: May 29, 2015

(87) PCT Pub. No.: WO2016/051449
PCT Pub. Date: Apr. 7, 2016

(65) Prior Publication Data
US 2016/0260657 A1    Sep. 8, 2016

(51) Int. Cl.
*H01L 23/495* (2006.01)
*H01L 23/29* (2006.01)
(Continued)

(52) U.S. Cl.
CPC ......... *H01L 23/49513* (2013.01); *H01L 21/56* (2013.01); *H01L 23/29* (2013.01);
(Continued)

(58) Field of Classification Search
CPC .......... H01L 21/56; H01L 24/32; H01L 24/48; H01L 24/73; H01L 24/92; H01L 23/49513; H01L 23/293; H01L 23/3107
(Continued)

(56) References Cited

U.S. PATENT DOCUMENTS 4,788,583 A * 11/1988 Kawahara ............. H01L 21/565
174/539
5,641,997 A * 6/1997 Ohta ....................... C08L 63/00
257/788

(Continued)

FOREIGN PATENT DOCUMENTS

JP    6-350000    12/1994
JP    8-078561    3/1996
(Continued)

OTHER PUBLICATIONS

International Search Report for PCT/JP2014/075819, mailed Dec. 16, 2014, 3 pages.
(Continued)

*Primary Examiner* — Nitin Parekh
(74) *Attorney, Agent, or Firm* — Nixon & Vanderhye P.C.

(57) ABSTRACT

In a semiconductor package, surfaces of a die pad, a semiconductor element, a connecting member, and a lead are subjected to a surface treatment with a silane coupling agent. A first surface of a plurality of surfaces of the semiconductor device includes a first region where an organic substance is exposed, and a second region where an inorganic substance is exposed, the first surface being bonded with the connecting member. A bonding strength between the first region and the sealing resin is weaker than a bonding strength between the second region and the sealing resin.

11 Claims, 6 Drawing Sheets

(51) Int. Cl.
 *H01L 23/31* (2006.01)
 *H01L 23/00* (2006.01)
 *H01L 21/56* (2006.01)

(52) U.S. Cl.
 CPC .......... *H01L 23/293* (2013.01); *H01L 23/31* (2013.01); *H01L 23/3107* (2013.01); *H01L 23/4952* (2013.01); *H01L 23/49524* (2013.01); *H01L 23/49541* (2013.01); *H01L 23/49562* (2013.01); *H01L 24/32* (2013.01); *H01L 24/34* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/0603* (2013.01); *H01L 2224/29139* (2013.01); *H01L 2224/32245* (2013.01); *H01L 2224/45124* (2013.01); *H01L 2224/48091* (2013.01); *H01L 2224/48106* (2013.01); *H01L 2224/48245* (2013.01); *H01L 2224/48247* (2013.01); *H01L 2224/48472* (2013.01); *H01L 2224/4903* (2013.01); *H01L 2224/49171* (2013.01); *H01L 2224/73265* (2013.01); *H01L 2224/8302* (2013.01); *H01L 2224/83048* (2013.01); *H01L 2224/92247* (2013.01); *H01L 2924/01028* (2013.01); *H01L 2924/13055* (2013.01); *H01L 2924/181* (2013.01); *H01L 2924/20102* (2013.01); *H01L 2924/20103* (2013.01); *H01L 2924/20104* (2013.01); *H01L 2924/20105* (2013.01)

(58) Field of Classification Search
 USPC .................................................. 257/666, 784
 See application file for complete search history.

(56) References Cited

U.S. PATENT DOCUMENTS

| | | | |
|---|---|---|---|
| 6,523,446 B1* | 2/2003 | Tanabe | H01L 23/4951 |
| | | | 257/E23.039 |
| 6,700,185 B1* | 3/2004 | Kawai | C09J 7/00 |
| | | | 156/247 |
| 2006/0043607 A1* | 3/2006 | Matsuura | H01L 21/561 |
| | | | 257/782 |

FOREIGN PATENT DOCUMENTS

| | | |
|---|---|---|
| JP | 11-297730 | 10/1999 |
| JP | 2001-118885 | 4/2001 |
| JP | 2005-072306 | 3/2005 |
| JP | 2005-226096 | 8/2005 |
| JP | 2005-340474 | 12/2005 |
| JP | 2006-319109 | 11/2006 |
| JP | 2011-082389 | 4/2011 |
| JP | 2012-023233 | 2/2012 |

OTHER PUBLICATIONS

Written Opinion of the ISA (non-English) for PCT/JP2014/075819, mailed Dec. 16, 2014, 3 pages.

Notice of Allowance dated Mar. 29, 2016 issued in Japanese Application No. 2015-508905 with English translation (6 pages).

* cited by examiner

METHOD OF MANUFACTURING SEMICONDUCTOR PACKAGE AND SEMICONDUCTOR PACKAGE

This application is the U.S. national phase of International Application No. PCT/JP2014/075819 filed 29 Sep. 2014, which designated the U.S., the entire contents of which is hereby incorporated by reference.

TECHNICAL FIELD

This invention relates to a method of manufacturing a semiconductor package and a semiconductor package.

BACKGROUND ART

Resin-sealed semiconductor packages are known, in which semiconductor elements, leads, connecting members, and a die pad are sealed by a sealing resin while the semiconductor elements are bonded on the die pad, and the semiconductor elements and the leads are connected by the connecting members (see Patent Documents 1-5).

CITATION LIST

Patent Document

[Patent Document 1] Japanese Patent Laid-Open Publication No. 2011-82389
[Patent Document 2] Japanese Patent Laid-Open Publication No. 2005-226096 JP
[Patent Document 3] Japanese Patent Laid-Open Publication No. 2005-340474
[Patent Document 4] Japanese Patent Laid-Open Publication No. 2005-072306
[Patent Document 5] Japanese Patent Laid-Open Publication No. H08-078561

DISCLOSURE OF THE INVENTION

Problems to be Solved by the Invention

A die pad is made of metal, and adhesion to a sealing resin is low. For this reason, peeling is likely to occur between the die pad and the sealing resin. A reliability test for the semiconductor package (a temperature cycle test, an environmental test such as intermittent operation test) is performed while the sealing resin is peeled off from the die pad, the die pad, the sealing resin, and the like thermally expand due to heat from the outside and self-heating of semiconductor elements. For this reason, the die pad and the sealing resin relatively move based on a difference in thermal expansion coefficients between the die pad and the sealing resin, and thus there is a possibility that a crack might occur to a bonding member for bonding the semiconductor element and the die pad. When a crack occurs to the bonding member, the electrical resistance between the semiconductor element and the die pad becomes high. Additionally, heat dissipation of the semiconductor element is also deteriorated.

In Patent Document 1, a roughening process is performed on an upper surface of the die pad to increase the adhesion between the die pad and the sealing resin, thereby suppressing the above problem. In Patent Document 1, after performing the roughening process on the upper surface of the die pad, the semiconductor elements are bonded onto the upper surface of the die pad. Then, the semiconductor elements and the leads are connected by connecting members, and thereafter sealing is performed with a sealing resin. In this method, the sealing resin fills a concavo-convex portion of the upper surface of the die pad, and thus the sealing resin and the concavo-convex portion are physically engaged. Therefore, relative movement between the die pad and the sealing resin is suppressed.

However, in this method, adhesion between the die pad and the sealing resin is generated only by the physical action, the engagement, of the die pad and the sealing resin. For this reason, the adhesion is not necessarily sufficient. Additionally, Patent Document 1 is silent about the adhesion between the sealing resin and the semiconductor element. In general, a surface of a semiconductor element is made of inorganic substance, such as a semiconductor oxide film and an electrode, and thus adhesion between the sealing resin and the semiconductor element is weak. For this reason, when the above-described reliability test is performed with respect to the semiconductor package, the sealing resin and the semiconductor element relatively move based on the difference in thermal expansion coefficients between the semiconductor element and the sealing resin. Thus, there is a possibility that cracks will occur to a bonding member that bonds the semiconductor device and the die pad.

On the other hand, a silane coupling agent is known as a technique for enhancing the adhesion between an inorganic substance (metal) and an organic substance (resin). Silane coupling a technique of chemically bonding metal and resin to increase the adhesion between the metal and the resin. In Patent Document 2, when a resin substrate to be mounted with the semiconductor package is bonded with a heat dissipation substrate made of metal, a silane coupling agent is applied onto a surface of the heat dissipation substrate, thereby improving the adhesion between the resin substrate and the heat dissipation substrate. Patent Documents 3 to 5 disclose a technique of mounting semiconductor elements on a lead frame whose surface has been processed with a silane coupling agent, and thereafter sealing the semiconductor element and the leads with a sealing resin.

However, in this method, an effort such as masking a region to be mounted with semiconductor elements is necessary so that a silane coupling agent does not inhibit the adhesion between the die pad and the bonding members. Additionally, although the adhesion between the die pad and the sealing resin is increased, there is still a room for improvement of the adhesion between the sealing resin and the semiconductor element.

On the other hand, increasing the adhesion between the sealing resin and the semiconductor element does not necessarily cause a favorable effect in improving the electrical characteristics of the semiconductor package. For example, when the semiconductor element and the sealing resin are firmly adhered, at the time of a reliability test, large stress is generated at an interface between the semiconductor element and the sealing resin, based on the difference in thermal expansion coefficients between the semiconductor element and the sealing resin. A plurality of layers to form an electrical circuit is formed in a semiconductor element. When large stress is generated at the interface between the semiconductor element and the sealing resin, cracks are generated on each layer, or each layer is peeled from one another, thereby making it likely to affect the electrical characteristics of the semiconductor element.

An object of the present invention is to provide a method of manufacturing a semiconductor package and a semiconductor package with high adhesion between the die pad and the sealing resin, with high adhesion between the semiconductor element and the sealing resin, and with excellent electrical characteristics of a semiconductor element.

Means For Solving the Problems

A method of manufacturing a semiconductor package according to one embodiment of the present invention includes, in a following order: a mounting step of bonding a semiconductor element onto an upper surface of a die pad; a connection step of electrically connecting the semiconductor element and a lead via a connecting member; a surface treatment step of performing a surface treatment with a silane coupling agent on surfaces of the die pad, the semiconductor element, the connecting member, and the lead; and a sealing step of sealing with a sealing resin, the die pad, the semiconductor element, the connecting member, and the lead. A first surface of a plurality of surfaces of the semiconductor device includes a first region where an organic substance is exposed, and a second region where an inorganic substance is exposed, the first surface being bonded with the connecting member. A bonding strength between the first region and the sealing resin is weaker than a bonding strength between the second region and the sealing resin.

A semiconductor package according to one embodiment of the present invention includes: a die pad; a semiconductor element bonded onto an upper surface of the die pad; a lead; a connecting member connecting the semiconductor device and the lead; and a sealing resin sealing the die pad, the semiconductor element, the connecting member, and the lead. Surfaces of the die pad, the semiconductor element, the connecting member, and the lead are subjected to a surface treatment with a silane coupling agent. A first surface of a plurality of surfaces of the semiconductor device includes a first region where an organic substance is exposed, and a second region where an inorganic substance is exposed, the first surface being bonded with the connecting member. A bonding strength between the first region and the sealing resin is weaker than a bonding strength between the second region and the sealing resin.

Effects of the Invention

According to the present invention, the surface treatment with a silane coupling agent is performed after the mounting of semiconductor devices and connection of the semiconductor devices with the leads are completed. Thus, not only the bonding strength between the die pad and the sealing resin, but also the bonding strength between the semiconductor element and the sealing resin are improved. Additionally, the terminal hydroxyl group of the silane coupling agent is less likely to bind to the first region where an organic substance is exposed, compared to the second region where an inorganic substance is exposed. Therefore, the bonding strength between the sealing resin and the first region is weaker than the bonding strength between the sealing resin and the second region. For this reason, when thermal expansion occurs due to heat from the outside of the semiconductor element or heating of the semiconductor element itself, stress, which is generated at the interface between the second region and the sealing resin based on the difference in thermal expansion coefficients between the semiconductor element and the sealing resin, can be relieved at portions, in the first region, of the semiconductor element and the sealing resin. As a result, it is possible to suppress cracks from occurring on each layer for forming the electric circuit, which are formed on the first surface side of the semiconductor element, and suppress each layer from peeling from one another, thereby making it possible to suppress the effect on the electrical characteristics of the semiconductor element. Accordingly, it is possible to provide a method of manufacturing a semiconductor package and a semiconductor package with high adhesion between the die pad and the sealing resin, with high adhesion between the semiconductor element and the sealing resin, and with excellent electrical characteristics of a semiconductor element.

MODE FOR CARRYING OUT THE INVENTION

First Embodiment (Semiconductor Package)

Figure 1:
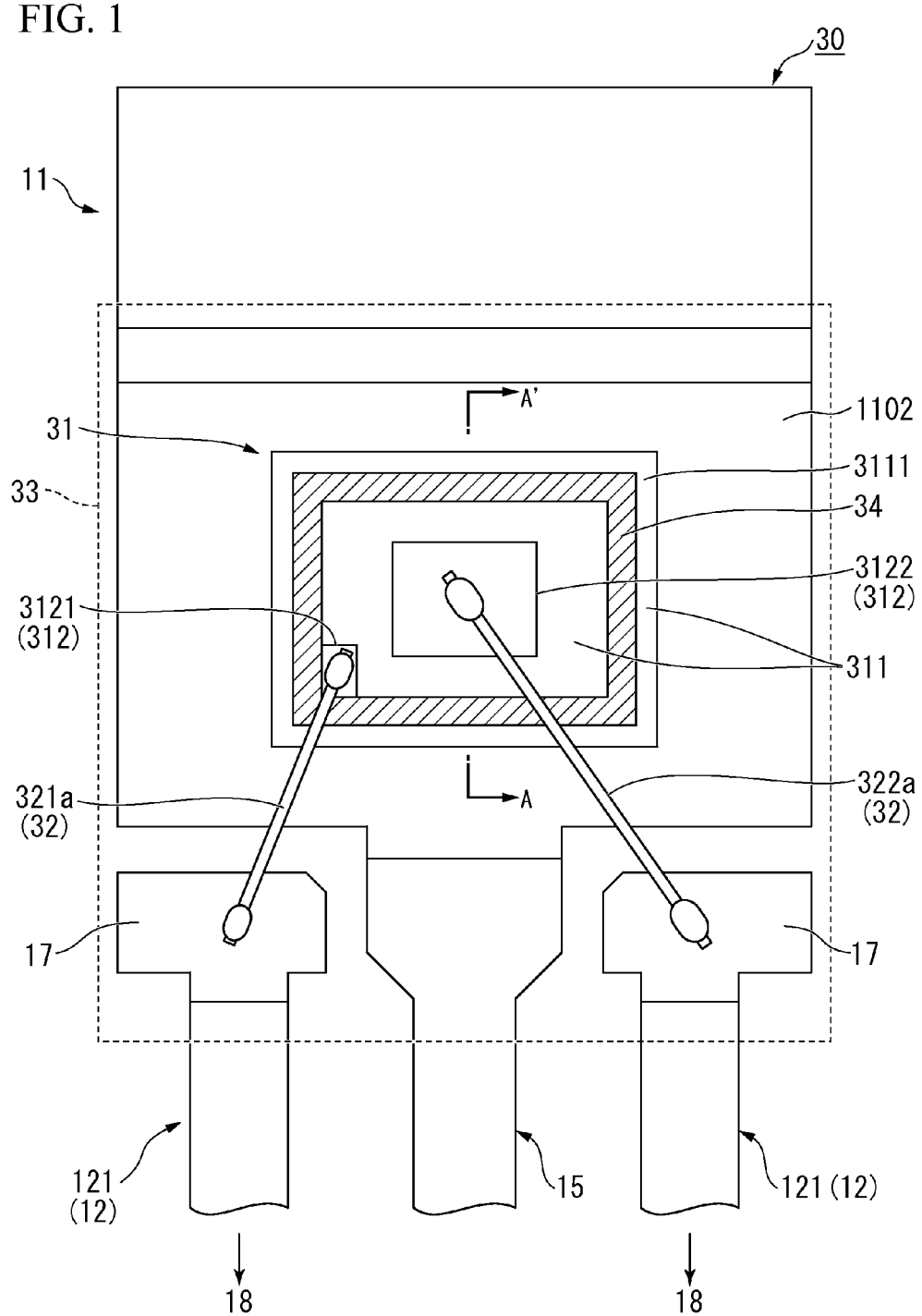
FIG. 1 is a top plan view showing a configuration of a semiconductor package according to the first embodiment.
Figure 2:
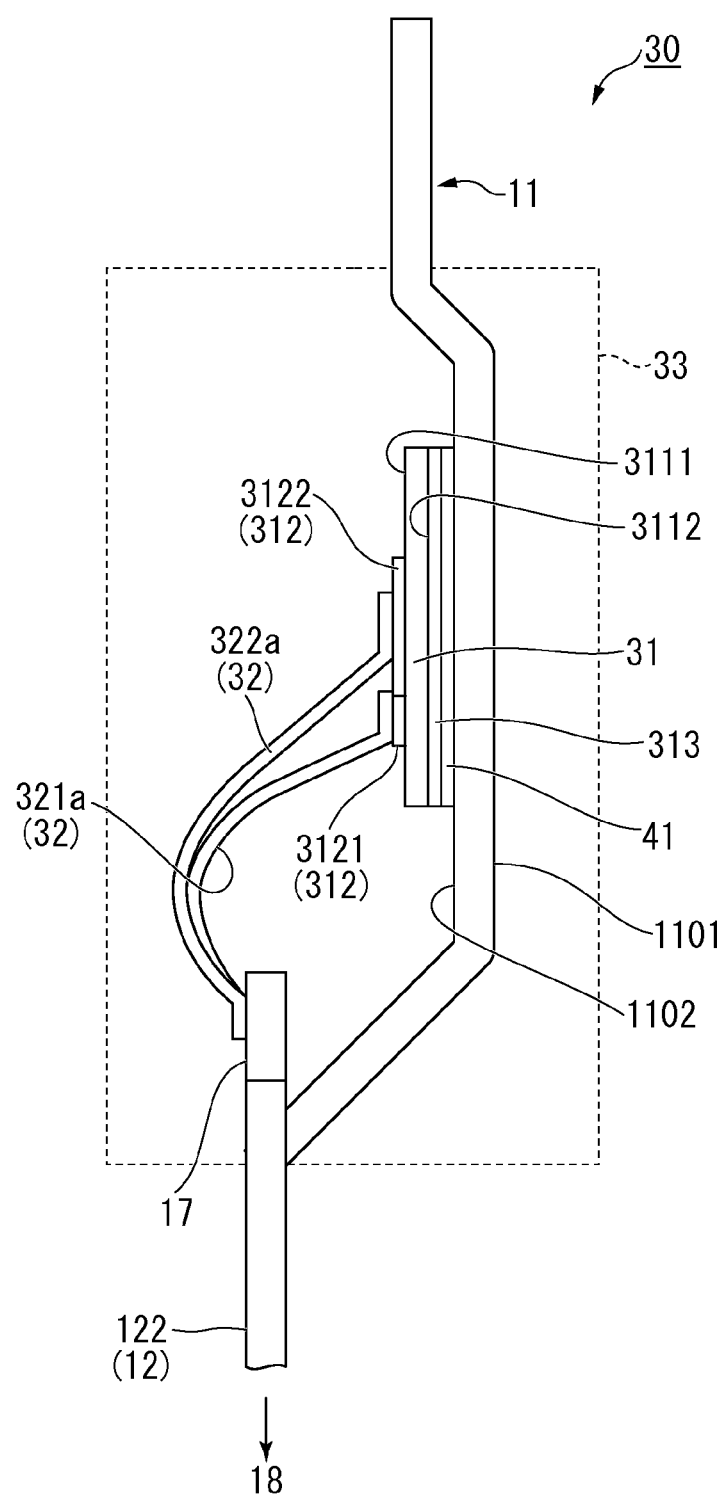
FIG. 2 is a side view showing the configuration of the semiconductor package according to the first embodiment.

Referring to FIGS. 1 to 4, a semiconductor package 30 according to a present embodiment will be described hereinafter. As shown in FIGS. 1 and 2, the semiconductor package 30 according to the present embodiment includes a die pad 11, a semiconductor element 31, a lead 12, and a hanging lead portion 15, a connecting member 32, and a sealing resin 33.

The die pad 11 is a plate member to be mounted with the semiconductor element 31. The die pad 11 has a first main surface 1101 and a second main surface (upper surface) 1102 opposite to the first main surface 1101, as shown in FIG. 2. The semiconductor element 31 is bonded to the second main surface 1102 of the die pad 11 using a bonding member 41, such as solder or silver paste.

Figure 4:
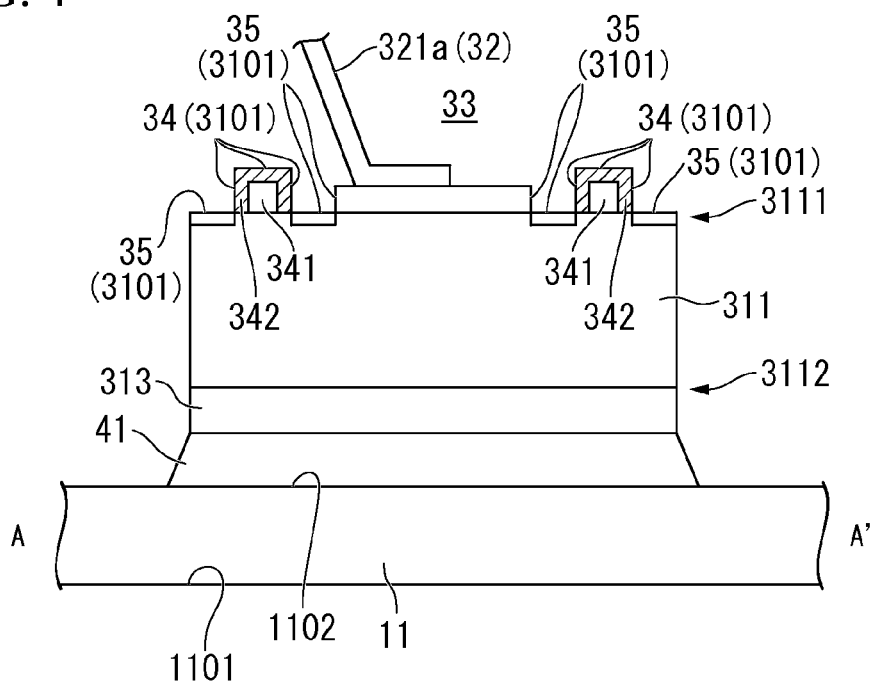
FIG. 4 is a cross-sectional view taken along A-A' shown in FIG. 1.

The semiconductor element 31 includes a base portion 311. The base portion 311 is a plate-like semiconductor with a rectangular shape in plan view. The base portion 311 is formed of, for example, silicon. An inorganic semiconductor oxide film, such as silicon oxide film ($SiO_2$), is formed on a surface of the base portion 311. As shown in FIG. 4, the base portion 311 includes a first main surface 3111 and a second main surface 3112 opposite to the first main surface 3111. The second main surface 3112 faces the second main surface 1102 of the die pad 11.

Figure 3:
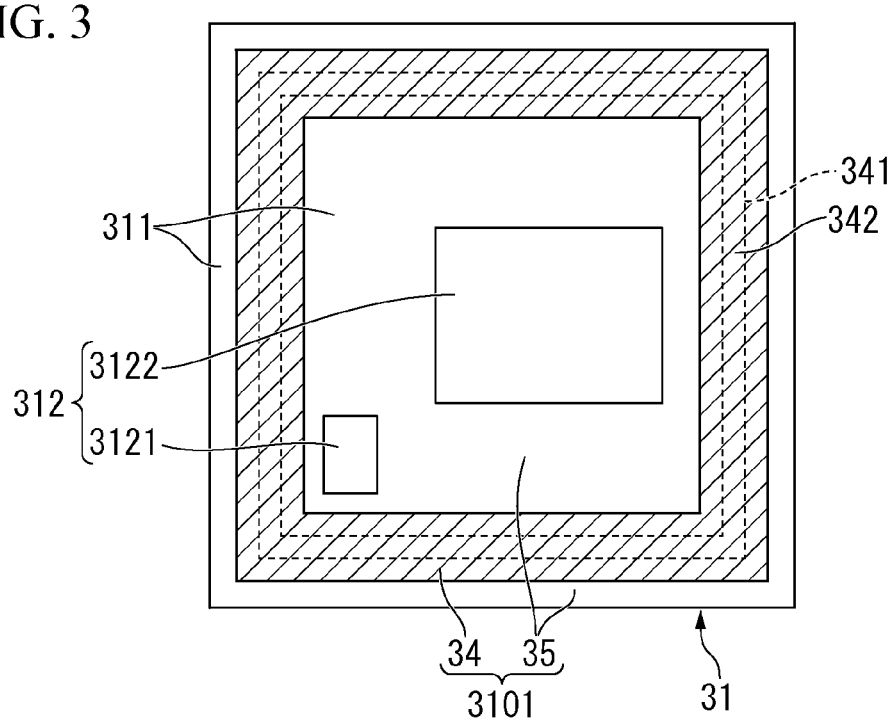
FIG. 3 is a top plan view showing a semiconductor device, seen from a side of a first surface on which a first electrode and a second electrode are formed.

As shown in FIGS. 3 and 4, the semiconductor element 31 includes a guard ring 341. The guard ring 341 is formed in a loop shape. The guard ring 341 is formed of, for example, aluminum. The guard ring 341 is provided on the first main surface 3111 of the base portion 311. The guard ring 341 is provided to protect against cracking which occurs at the time of scribing the semiconductor element 31. An insulating layer 342 is formed on the surface of the guard ring 341. The insulating layer 342 is manufactured by, for example, forming a layer of TEOS (tetraethoxysilane) on the surface of the guard ring 341, and thereafter laminating a layer of an organic substance on the layer of TEOS. The organic substance is, for example, polyimide. The surface of the insulating layer 342 is formed of an organic substance.

The semiconductor element 31 includes electrode portions 312. The electrode portions 312 are plate-like metal members provided to electrically connect the semiconductor element 31 and the leads 12. The electrode portions 312 are provided in regions of the first main surface 3111 of the base portion 311, which are surrounded by the guard ring 341 in plan view.

The electrode portions 312 are formed of metal. The electrode portions 312 are formed of, for example, aluminum. Metal oxide, such as an aluminum oxide film ($Al_2O_3$), is formed on surfaces of the electrode portions 312. The electrode portions 312 include, for example, a first electrode 3121 and a second electrode 3122.

Hereinafter, among the surfaces of the semiconductor element 31, a surface of the semiconductor element 31 to be bonded with connecting members 32 is referred to as a first surface 3101. The first surface 3101 is the outermost surface, on the first main surface 3111 side, of the semiconductor element 31. The first surface 3101 includes the first main surface 3111 of the base portion 311, the surface of the insulating layer 342, and the surfaces of the electrode portions 312. The surface of the base portion 311 includes an inorganic substance, such as semiconductor or a semiconductor oxide film. The surface of the insulating layer 342 includes an organic film made of an organic substance, such as polyimide. The surfaces of the electrode portions 312 include an inorganic substance, such as metal or metal oxide. Thus, the first surface 3101 includes a first region 34 where the organic substance is exposed, and a second region 35 where the inorganic substance is exposed.

The first region 34 includes the surface of the insulating layer 342. The second region 35 includes the surfaces of the electrode portions 312, and the first main surface 3111 of the base portion 311. Here, the surface of the electrode portion 312 may include a portion where an organic film is formed. In this case, the first region 34 includes a surface of the organic substance provided on the electrode portion 312. At least a part of the surfaces of the electrode portions 312 is included in the second region 35.

The connecting member 32 is, for example, a bonding wire, as shown in FIGS. 1 and 2. The bonding wire is formed of the same inorganic substance as that of the electrode portion 312, for example, aluminum. The connecting member 32 includes a first connecting member 321a and a second connecting member 322a.

The first connecting member 321a is bonded by wire bonding onto a surface of a portion included in the second region 35 of the first electrode 3121. The second connecting member 322a is bonded by wire bonding onto a surface of a portion included in the second region 35 of the second electrode 3122.

The semiconductor element 31 includes a third electrode 313, as shown in FIGS. 2 and 4. The third electrode 313 is formed on the second main surface 3112 of the base portion 311. The semiconductor element 31 is, for example, a bipolar transistor, in which the first electrode 3121 is a gate electrode, and the second electrode 3122 is a source electrode, and the third electrode 313 is a drain electrode.

The lead 12 includes a first end portion 17 and a second end portion 18. The connecting member 32 is connected to the first end portion 17. The first end portion 17 of the lead 12 is applied with, for example, nickel plating.

The leads 12 are arranged separately at one end of the die pad 11 in plan view. The leads 12 are formed to extend in a direction away from the one end of the die pad 11 along the main surfaces 1101 and 1102 of the die pad 11. Of the longitudinal end portions of the lead 12, an end portion adjacent to the die pad 11 is a first end portion 17. An end portion positioned away from the die pad 11 is a second end portion 18.

Returning to FIG. 1, the hanging lead portion 15 extends from one end of the die pad 11 in the longitudinal direction of the lead 12. The hanging lead portion 15 is, for example, a drain line. The hanging lead portion 15 is electrically connected to the third electrode 313 through the die pad 11.

The die pad 11, the leads 12, and the hanging lead portion 15 are sealed by the sealing resin 33. The first end portion 17 of the lead 12 is sealed by the sealing resin 33. The second end portion 18 of the lead 12 extends from the sealing resin 33. Additionally, the first main surface 1101 of the die pad 11 is exposed to the outside of the sealing resin 33.

The sealing resin 33 contains a silane coupling agent. The silane coupling agent contained in the sealing resin 33 functions as, for example, curing accelerator at the time of curing the sealing resin 33, and adhesion accelerator for enhancing the adhesion between the sealing resin 33 and the die pad 11, and the adhesion between the sealing resin 33 and the semiconductor element 31. Here, as the silane coupling agent contained in the sealing resin 33, for example, a silane coupling agent different from the silane coupling agent used in a later-described surface treatment is used, but the same silane coupling agent as used in the surface treatment may be used.

Surfaces of the die pad 11, the semiconductor element 31, the connecting members 32, the leads 12, and the hanging lead portion 15 are subjected to the surface treatment with the silane coupling agent while the semiconductor element is bonded onto the die pad, and the semiconductor element and the lead are connected by the connecting member, thus enhancing the bonding strength with the sealing resin 33. Molecules of the silane coupling agent have a structure such that two kinds of functional groups are bonded to a silicon atom. The two kinds of functional groups include a first functional group with an end chemically bonded to an organic substance and a second functional group with an end chemically bonded to an inorganic substance. The second functional group binds with an inorganic substance by, for example, being dehydration-condensed by hydrolysis with the hydroxyl group of the surface of the inorganic substance. Thus, by using a silane coupling agent, it is possible to couple the sealing resin 33 that is an organic substance, the die pad 11 that is an inorganic substance, and the like. As the silane coupling agent, known substances, such as 3-mercaptopropyl trimethoxy silane or 3-acryloxypropyltrimethoxysilane, may be used.

(Manufacturing Method)

Hereinafter, a manufacturing method according to the present embodiment will be described mainly with reference to FIGS. 5 and 6.

When the semiconductor package 30 is manufactured, a lead frame having the die pad 11, the leads 12 and the hanging lead portion 15, which are shown in FIG. 1, is prepared. The lead frame further includes a coupling frame portion (not shown) for coupling the die pad 11 and the plurality of leads 12 together. The lead frame is obtained by performing a press work on a plate material with conductivity, such as a copper plate.

In the manufacturing method of the present embodiment, the hanging lead portion 15 is bent to shift the die pad 11 in the thickness direction thereof, with respect to the lead 12. Thus, the leads 12 are positioned above the second main surface 1102 of the die pad 11 (see FIG. 2).

(Mounting Step S1)

Figure 5:
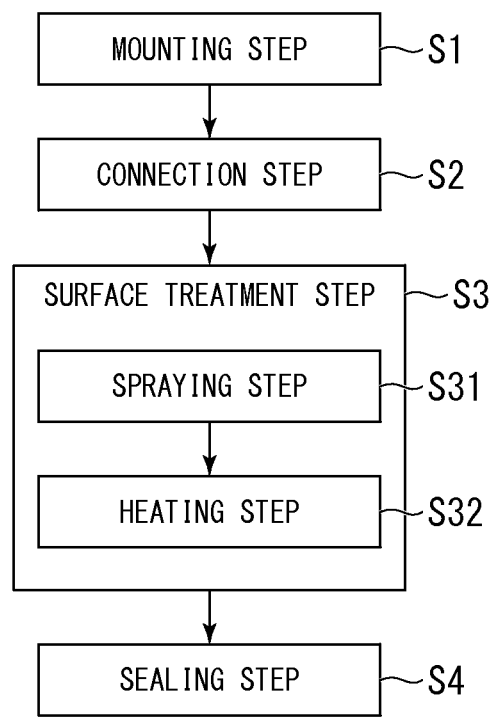
FIG. 5 is a view showing a flow of a manufacturing method according to the first embodiment.
Figure 6A:
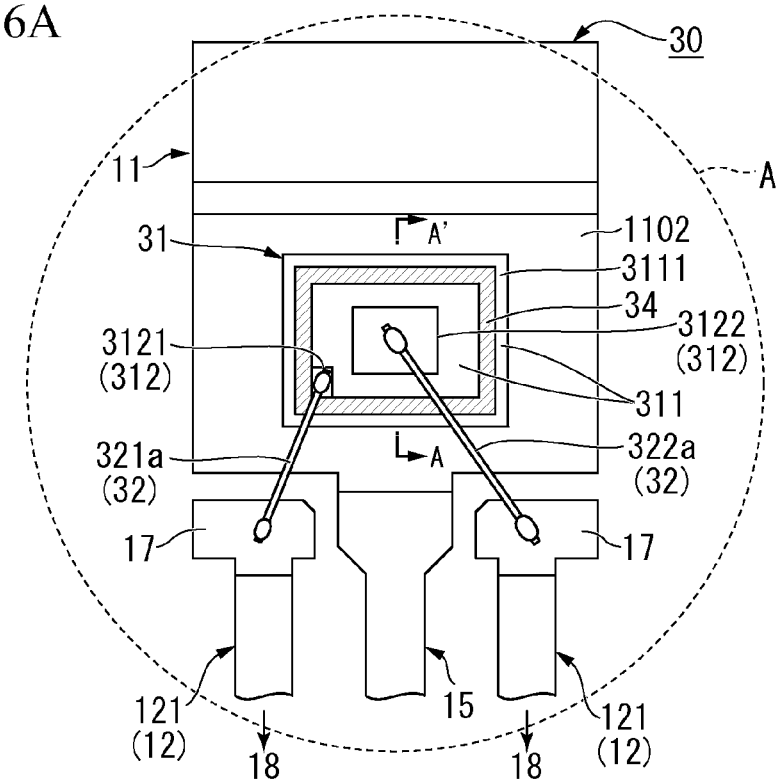
FIG. 6 is a view showing a region onto which a silane coupling agent is sprayed in a spraying process and a surface onto which a silane coupling agent is applied.
Figure 6B:
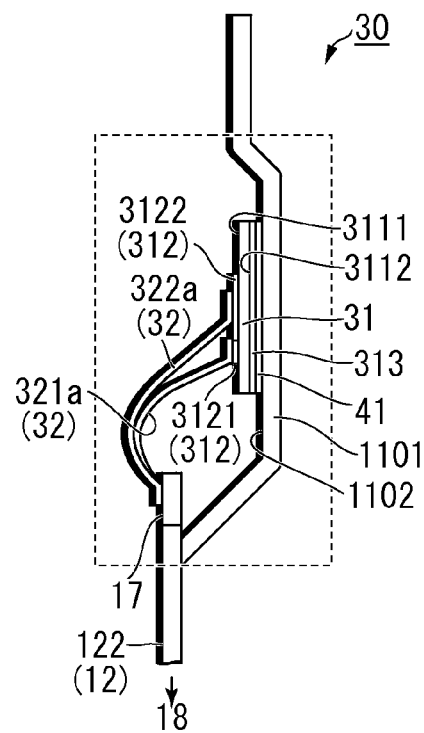

As shown in FIG. 5, in the method of manufacturing the semiconductor package 30 of the present embodiment, first, the semiconductor element 31 is mounted onto the second main surface (upper surface) 1102 of the die pad 11 (see FIGS. 1 and 2).

In the mounting step S1, as shown in FIGS. 1 and 2, the semiconductor element 31 is placed on the second main surface (upper surface) 1102 of the die pad 11. The semiconductor element 31 is placed so that the second main surface 3112 of the base portion 311 faces the second main surface 1102 of the die pad 11. The third electrode 313 formed on the second surface 3102 opposite to the first surface 3101 of the semiconductor element 31 is bonded onto the second main surface 1102 of the die pad 11, by the bonding member 41, such as solder or silver paste. The bonding with solder is performed by, for example, a reflow method. By the bonding member, the third electrode 313 is electrically connected to the die pad 11.

(Connection Step S2)

Next, as shown in FIG. 5, the semiconductor element 31 and the leads 12 are electrically connected by the connecting members 32. In the connection step, both ends of the connecting member 32 are connected to the semiconductor element 31 and the leads 12 (see FIGS. 1 and 2).

In the connection step S2, as shown in FIGS. 1 and 2, the first electrode 3121 of the semiconductor element 31 is connected to the first lead 121 by the first bonding wire 321a. Additionally, the second electrode 3122 of the semiconductor element 31 is connected to the second lead 122 by the second bonding wire 322a.

(Surface Treatment Step S3)

Next, as shown in FIG. 5, the surfaces of the die pad 11, the semiconductor element 31, the connecting members 32, the leads 12, and the hanging lead portion 15 are subjected to a surface treatment with a silane coupling agent (see FIGS. 1 and 2). The surface treatment step S3 includes, for example, a spraying step S31 and a heating step S32 in this order.

In the spraying step S31, a solution obtained by diluting a silane coupling agent with ethanol, methanol, isopropyl alcohol, and the like is sprayed from, for example, the second main surface 1102 side of the die pad 11, onto the surfaces of the die pad 11, the semiconductor element 31, the connecting members 32, the leads 12, and the hanging lead portion 15. As indicated by a dotted line shown in FIG. 6(a), an area to be sprayed is an area A including the entire region to be sealed by the sealing resin 33 (see FIG. 1). As a result, as indicated by thick lines shown in FIG. 6(b), the silane coupling agent is applied onto the surface of the die pad 11, the surfaces of the base portion 311 and the electrode portions 312 of the semiconductor element 31, the upper surfaces of the connecting members 32, the first end portions 17 of the leads 12, and the upper surface of the hanging lead portion 15. By this method, it is possible to efficiently perform, without waste, the surface treatment on the surfaces of the die pad 11, the semiconductor element 31, the connecting members 32, and the leads 12.

In the present embodiment, the base portion 311 is formed of silicon. For this reason, the surface of the base portion 311 includes a silicon oxide ($SiO_2$) film. Additionally, the electrode portions 312 are formed of aluminum. For this reason, the surfaces of the electrode portions 312 include an aluminum oxide ($Al_2O_3$) film.

According to the semiconductor module of the present embodiment, effects similar to those of the second embodiment can be achieved.

On the other hand, in the first region 34, on the surface of which the organic substance is exposed, the number of exposed hydroxyl ends is small, compared to the second region 35 including the base portion 311 and the electrode portions 312. For this reason, the second functional group of the silane coupling agent is less likely to bind onto the first region 34. Therefore, the bonding strength between the sealing resin 33 and the first region 34 is weaker than the bonding strength between the sealing resin 33 and the second region 35.

When reliability tests, such as a temperature cycle test and an intermittent operation test, are performed, the semiconductor element 31 is heated from the outside, or the semiconductor element 31 itself generates heat. The semiconductor element 31 and the sealing resin 33 are thermally expanded by the generated heat. Based on a difference in thermal expansion coefficients therebetween, large stress is generated at an interface between the second region 35 including the electrode portions 312 and the base portion 311, and the sealing resin 33 tightly bonded to the second region 35.

On the other hand, the bonding strength between the sealing resin 33 and the first region 34 is weaker than the bonding strength between the sealing resin 33 and the second region 35. Therefore, large stress does not occur at an interface between the first region 34 and the sealing resin 33. For this reason, the stress generated at the interface between the second region 35 of the semiconductor element 31 and the sealing resin 33 is relieved at the portions, in the first region 34, of the semiconductor element and the sealing resin. As a result, it is possible to suppress the stress from strongly acting to the second region 35.

The mechanism that the stress generated at the interface between the semiconductor element 31 and the sealing resin 33 is relieved by forming the first region 34 is as follows. When the heat is applied to the semiconductor element 31 and the sealing resin 33, each of the semiconductor element 31 and the sealing resin 33 thermally expands. Due to the thermal expansion, each of the semiconductor element 31 and the sealing resin 33 expands in a direction parallel to the interface. The semiconductor element 31 and the sealing resin 33 have different thermal expansion coefficients. For this reason, the length of the expansion differs between the semiconductor element 31 and the sealing resin 33. Hereinafter, it is assumed that the semiconductor element 31 has a larger thermal expansion coefficient than that of the sealing resin 33. A case where the sealing resin 33 has a larger thermal expansion coefficient than that of the semiconductor element 31 can be described similarly.

In a case where the bonding strength between the semiconductor element 31 and the sealing resin 33 is strong, the sealing resin 33 with a short length of the expansion follows the semiconductor element 31 with a large length of the expansion, and thus is displaced in a direction parallel to the interface. For this reason, in the vicinity of the interface, the sealing resin 33 is subjected to elastic force proportional to the displacement amount of the sealing resin 33. The displacement amount is proportional to a difference in lengths of the expansion between the semiconductor element 31 and the sealing resin 33. As a result, stress is considered to be generated in the vicinity of the interface.

The length of the expansion of the semiconductor element 31 and the length of the expansion of the sealing resin 33 are proportional to the length of the bonded surface of the semiconductor element 31 and the sealing resin 33 before the heat is applied thereto. Therefore, as the bonded surface of the semiconductor element 31 and the sealing resin 33 becomes longer, the stress generated in the vicinity of the interface becomes larger.

In a state before heat is applied, the first region 34 is formed on a part of the bonded surface of the semiconductor element 31 and the sealing resin 33. In the first region 34, the bonding strength between the semiconductor element 31 and the sealing resin 33 is weak. Therefore, the sealing resin 33 is unlikely to follow the semiconductor element 31 and to be displaced. For this reason, the length of the bonded surface of the semiconductor element 31 and the sealing resin 33 becomes substantially shortened. As a result, it is possible to make the stress generated in the vicinity of the interface smaller.

The above is the mechanism that stress is relieved by forming the first region 34.

Additionally, the coupling force of the base portion 311 and the electrode portions 312 with the sealing resin is strong. For this reason, there is little possibility that the entire base portion 311 and the entire electrode portions 312 will be peeled from the sealing resin 33. Therefore, it is possible to improve the electrical characteristics of the semiconductor element 31 without greatly impairing the adhesion between the semiconductor element 31 and the sealing resin 33.

Further, the bonding strength between the first region 34 and the sealing resin 33 is weaker than the bonding strength between the surface of the electrical connection portion and the sealing resin 33. Thus, it is possible to protect the connecting members 32 bonded to the electrode portions 312 from pealing therefrom. Thus, it is possible to improve the connection reliability between the semiconductor element 31 and the connecting members 32.

Further, in the present embodiment, the first region 34 is formed in a loop shape. This configuration enables stress generated based on the difference in thermal expansion coefficients between the semiconductor element 31 and the sealing resin 33, even if the stress progresses toward either direction in the first surface 3101, to be relieved at the portions, in the first region 34, of the semiconductor element and the sealing resin.

Moreover, the number of exposed hydroxyl ends on the bonding member 41 is small, compared to the second region 35 on which inorganic substances are exposed, and the upper surface of the die pad 11. Therefore, the hydroxyl ends of the silane coupling agent are unlikely to bond to the bonding member 41. For this reason, the bonding strength between the sealing resin 33 and the bonding member 41 is weaker than the bonding strength between the sealing resin 33 and the second region 35, and the bonding strength between the sealing resin 33 and the die pad 11. For this reason, it is possible to relieve at the surface of the bonding member 41, the stress generated between the semiconductor element 31 and the die pad 11 due to the difference in thermal expansion coefficients among the semiconductor element 31, the die pad 11, and the sealing resin 33. Thus, it is possible to suppress cracks from being generated in the joint member 41, without greatly impairing the adhesion between the semiconductor element 31 and the die pad 11 and the sealing resin 33. As a result, it is possible to improve the electrical characteristics of the semiconductor element 31.

Here, the material for forming the base portion 311, and the material for forming the electrode portions 312 are not limited to the above combination. Semiconductor materials and metal materials may be selected as appropriate. Additionally, it is also possible to control the number of hydroxyl groups on surfaces, by performing a surface treatment as appropriate in accordance with the characteristics of a material. For this reason, it is possible to, for a combination of various materials, make the bonding strength between the electrode portion 312 and the sealing resin 33 weaker than the bonding strength between the base portion 311 and the sealing resin 33.

In the heating step S32, the lead frame sprayed with the solution is heated. In the heating process S32, the lead frame sprayed with the solution is heated at a temperature of, for example, 25° C. to 250° C. (more preferably, 50° C. to 150° C.). Since the heating temperature is relatively low, the dehydration condensation reaction of the silane coupling agent is difficult to proceed at the electrode portions. For this reason, adhesion between the electrode portion 312 and the sealing resin 33 is suppressed from becoming excessively strong.

(Sealing Step S4)

Next, the die pad 11, the semiconductor element 31, the connecting members 32, the leads 12, and the hanging lead portion 15 are sealed by the sealing resin 33, as shown in FIG. 5. When the sealing step is performed, a mold (not shown) fabricated so as to match the outside shape of the semiconductor package 30 is prepared in advance. In the sealing step S4, the die pad 11, the semiconductor element 31, the connecting members 32, the leads 12, and the hanging lead portion 15 are installed in the mold. Then, a sealing resin 33 is flowed onto the mold and is cured.

In the present embodiment, a silane coupling agent is contained in the sealing resin 33. According to this configuration, the silane coupling agent contained in the sealing resin 33 has a function as an adhesion imparting agent. Thus, the adhesion between the sealing resin 33 and the die pad 11 and the adhesion between the sealing resin 33 and the semiconductor element 31 are increased. Additionally, the silane coupling agent contained in the sealing resin 33 is occasionally used as a curing accelerator or the like at the time of curing the sealing resin 33, and a required function thereof is not necessarily the same as a required function of the silane coupling agent used in the surface treatment step S3. If the silane coupling agent contained in the sealing resin 33 is different from the silane coupling agent used in the surface treatment step S3, it is possible to select appropriate silane coupling agents in accordance with the respective functions required thereto.

By the above sealing step S4, the coupling frame portion (not shown) excluding the one end, on the die pad side, of the hanging lead section 15, and the second end portion 18 of the lead 12, are disposed outside the sealing resin 33.

After the sealing step S4, the coupling frame portion excluding the one end of the hanging lead portion 15 is cut off. Additionally, according to need, the second end portion 18 of each lead 12 is subjected to a bending processing. Thus, the semiconductor package 30 shown in FIGS. 1 and 2 is obtained. Here, in the illustrated example, the sealing resin 33 is formed so as to expose the first main surface 1101. However, the lead frame and the molding die may be designed so that the first main surface 1101 is buried in the sealing resin 33.

The first embodiment of the present invention has been described above. In the present embodiment, the surfaces of the die pad 11 and the semiconductor element 31 are subjected to a surface treatment with a silane coupling agent. Therefore, not only the adhesion between the die pad 11 and the sealing resin 33, but also the adhesion between the semiconductor element 31 and the sealing resin 33 are increased. Thus, even when a temperature cycle test or the like is performed, peeling becomes unlikely to occur between the semiconductor element 31 and the sealing resin 33. Thereby, it is possible to suppress cracks from occurring in the bonding member 41 that connects the semiconductor element 31 and the die pad 11.

The adhesion between the first region 34 and the sealing resin 33 is weaker than the adhesion between the electrode portion 312 and the sealing resin 33 and the adhesion between the base portion 311 and the sealing resin 33. For this reason, when a reliability test is performed, stress generated at the interface between the second region 35 of the semiconductor element 31 and the sealing resin 33 is relieved at the portions, in the first region 34, of the semiconductor element and the sealing resin. Therefore, it is possible to suppress the stress generated in the sealing resin 33 from acting strongly to the electrode portions 312. On the other hand, the bonding force between the base portion 311 and the sealing resin 33 and the bonding force between the electrode portion 312 and the sealing resin 33 are strong. For this reason, there is little possibility that the entire base portion 311 and the entire electrode portion 312 will be peeled from the sealing resin 33. Thus, it is possible to improve the electrical characteristics of the semiconductor element 31, without greatly impairing the adhesion between the semiconductor element 31 and the sealing resin 33.

As described above, according to the present embodiment, it is possible to provide the semiconductor package 30 with high adhesion between the die pad 11 and the sealing resin 33, with high adhesion between the semiconductor element 31 and the sealing resin 33, and with excellent electrical characteristics of the semiconductor element 31.

Second Embodiment

Hereinafter, referring to FIG. 7, a semiconductor package 30b of the present embodiment will be described. Hereinafter, the same reference numerals are appended to the same components as those shown in FIGS. 1 to 6, and description thereof is omitted.

Figure 7:
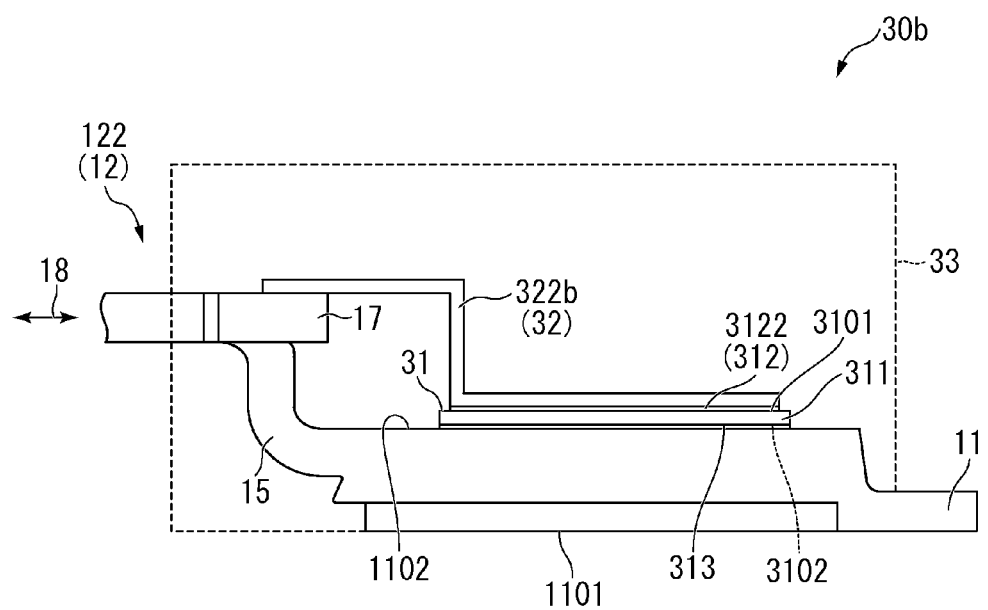
FIG. 7 is a side view showing a configuration of a semiconductor package according to a second embodiment.

As shown in FIG. 7, in the present embodiment, the connecting member 32 is not a bonding wire, but a clip connector. In this regard, the present embodiment is different from the first embodiment.

The clip connector is strip-shaped connecting member, which is formed by bending a conductive plate. One end face of the clip connector is bonded onto the face of the first end portion 17 of the lead 12 via a bonding member, such as solder or silver paste. The other end face of the clip connector is bonded onto the face of the electrode portion 312 via a bonding member, such as solder or silver paste.

The clip connectors include, for example, a first clip connector (not shown) and a second clip connector 322b. The first electrode 3121 (see FIGS. 1 and 2) is connected to the first clip connector. The second electrode 3122 is connected to the second clip connector 322b.

The semiconductor package 30b of the present embodiment is manufactured by a manufacturing method similar to that of the first embodiment. According to the present embodiment, the same effects as those of the first embodiment can be achieved.

The preferred embodiments of the present invention have been described above with reference to the accompanying drawings. However, it is needless to say that the invention is not limited to those embodiments. The shapes, combinations, and the like of the components shown in the above-described embodiments are merely one example, and various modifications may be made based on design requirements or the like, without departing from the scope of the invention.

EXAMPLES

Hereinafter, the present invention will be described in more detail, using the following example. However, the present invention is not limited to the following example at all.

Example

Semiconductor packages were manufactured using a sealing resin (epoxy resin). In the manufacturing process, the above-described surface treatment step was performed. As a silane coupling agent to be sprayed, 3-mercaptopropyl trimethoxysilane was used.

A pre-treatment was performed on samples of the semiconductor packages manufactured in the above-described manner, and thereafter a temperature cycle test was performed. In the pre-treatment, the following three processes were performed in this order.

(Pre-Treatment 1) Ta (ambient temperature)=125° C., 24 hours
(Pre-Treatment 2) Ta=85° C., RH (relative humidity)=85%, 168 hours
(Pre-Treatment 3) IR reflow (260° C., 2 cycles)

The temperature cycle test was performed under the following conditions.

(Conditions) Minimum Storage Temperature=−55° C., Maximum Storage Temperature=150° C., and 1000 cycles Under the above conditions, the temperature cycling test was performed with respect to the same number of samples, and a variation of the thermal resistance characteristics of the semiconductor packages was evaluated.

Comparative Example

Semiconductor packages were manufactured without performing the surface treatment. The other manufacturing conditions were the same as in the example. Also in the comparative example, the same temperature cycle test as in the example was performed, and a variation of the thermal resistance characteristics was evaluated.

Result of Test

In the example where the surface treatment was performed, no defective products were generated until the end of 1000 cycles. In contrast, in the comparative example where no surface treatment was performed, defective products had already been generated at the end of 300 cycles, and the defective products generated at the end of 1000 cycles in the comparative example were 77% of the total samples.

As shown above, in the example where the surface treatment was performed, no defective products were generated, while defective products are generated in the comparative example where no surface treatment was performed. It is suggested from these results that it is possible to, using the present invention, enhance the adhesion between the die pad and the sealing resin and the adhesion between the semiconductor element and the sealing resin, and to improve the reliability of the connection between the semiconductor element and the connecting member.

DESCRIPTION OF REFERENCE SYMBOLS

11: die pad
12: lead
31: semiconductor element
32: connecting member
33: sealing resin
30: semiconductor package
312: electrode portion
34: first region
35: second region
41: connecting member
S1: mounting step
S2: connection step
S3: surface treatment step
S31: spraying step
S32: heating step
S4: sealing step

The invention claimed is:

1. A method of manufacturing a semiconductor package, the method comprising, in a following order:
 a mounting step of bonding a semiconductor element onto an upper surface of a die pad;
 a connection step of electrically connecting the semiconductor element and a lead via a connecting member;
 a surface treatment step of performing a surface treatment with a silane coupling agent on surfaces of the semiconductor element, the connecting member and portions of the die pad, and the lead; and
 a sealing step of sealing with a sealing resin, the semiconductor element, the connecting member and portions of the die pad and the lead;
 wherein a first surface of a plurality of surfaces of the semiconductor element includes a first region where an organic substance is exposed, and a second region where an inorganic substance is exposed, a portion of the second region being electrically bonded with the connecting member, and
 a bonding strength between the first region and the sealing resin is weaker than a bonding strength between the second region and the sealing resin.

2. The method of manufacturing the semiconductor package according to claim 1, wherein
 the first surface of the semiconductor element is provided with an electrode portion to be electrically connected to the connecting member,
 the electrode portion and the connecting member form an electrical connection portion,
 a surface of the electrical connection portion contains an inorganic substance, and
 the bonding strength between the first region and the sealing resin is weaker than a bonding strength between the surface of the electrical connection portion and the sealing resin.

3. The method of manufacturing the semiconductor package according to claim 1, wherein
 in the mounting step, the die pad and the semiconductor element are bonded using a bonding member,
 in the surface treatment step, the surface treatment with the silane coupling agent is performed on a surface of the bonding member,
 the bonding strength between the second region and the sealing resin is stronger than the bonding strength between the bonding member and the sealing resin, and
 a bonding strength between the upper surface of the die pad and the sealing resin is stronger than the bonding strength between the bonding member and the sealing resin.

4. The method of manufacturing the semiconductor package according to claim 1, wherein the surface treatment step comprises, in a following order:
 a spraying step of spraying a solution containing the silane coupling agent onto surfaces of the die pad, the semiconductor element, the connecting member, and the lead; and
 a heating step of heating the solution.

5. The method of manufacturing the semiconductor package according to claim 4, wherein in the heating step, a lead frame including the die pad and the lead is heated at a temperature of 25° C. to 150° C.

6. The method of manufacturing the semiconductor package according to claim 1, wherein the sealing resin contains a silane coupling agent.

7. A semiconductor package comprising:
 a die pad;
 a semiconductor element bonded onto an upper surface of the die pad;
 a lead;
 a connecting member connecting the semiconductor element and the lead; and
 a sealing resin sealing the semiconductor element, the connecting member and portions of the die pad and the lead,
 wherein surfaces of the semiconductor element, the connecting member and portions of the die pad, and the lead are subjected to a surface treatment with a silane coupling agent,
 a first surface of a plurality of surfaces of the semiconductor element includes a first region where an organic substance is exposed, and a second region where an inorganic substance is exposed, a portion of the second region being electrically bonded with the connecting member, and
 a bonding strength between the first region and the sealing resin is weaker than a bonding strength between the second region and the sealing resin.

8. The semiconductor package according to claim 7, wherein
 the first surface of the semiconductor element is provided with an electrode portion to be electrically connected to the connecting member,
 the electrode portion and the connecting member form an electrical connection portion,
 a surface of the electrical connection portion contains an inorganic substance, and
 the bonding strength between the first region and the sealing resin is weaker than a bonding strength between the surface of the electrical connection portion and the sealing resin.

9. The semiconductor package according to claim 7, wherein the first region is formed in a loop shape.

10. The semiconductor package according to claim 1, wherein
 the die pad and the semiconductor element are bonded using a bonding member, an exposed surface of the bonding member has been subjected to the surface treatment with the silane coupling agent, the bonding strength between the second region and the sealing resin is stronger than the bonding strength between the bonding member and the sealing resin, and a bonding strength between the upper surface of the die pad and the sealing resin is stronger than the bonding strength between the bonding member and the sealing resin.

11. The semiconductor package according to claim 7, wherein the sealing resin contains a silane coupling agent.

* * * * *